United States Patent [19]
Chung

[11] Patent Number: 4,953,182
[45] Date of Patent: Aug. 28, 1990

[54] GAIN AND PHASE CORRECTION IN A DUAL BRANCH RECEIVER

[75] Inventor: Kah-Seng Chung, Bull Creek, Australia

[73] Assignee: U.S. Philips Corporation, New York, N.Y.

[21] Appl. No.: 241,171

[22] Filed: Sep. 6, 1988

[30] Foreign Application Priority Data

Sep. 3, 1987 [EP] European Pat. Off. ........ 87201667.0

[51] Int. Cl.$^5$ ............................................. H04B 1/30
[52] U.S. Cl. ...................................... 375/97; 455/260; 455/324; 375/98
[58] Field of Search ........................ 375/75, 77, 97, 98; 455/234, 237, 245, 257, 259, 260, 324; 358/174, 175, 195.1, 188; 329/50, 360, 363

[56] References Cited
U.S. PATENT DOCUMENTS

| | | | |
|---|---|---|---|
| 4,476,585 | 10/1984 | Reed | 455/324 |
| 4,574,246 | 3/1986 | Yoshida | 455/245 |
| 4,584,710 | 4/1986 | Hansen | 375/97 |

Primary Examiner—Benedict V. Safourek
Attorney, Agent, or Firm—David R. Treacy

[57] ABSTRACT

A dual branch receiver consists of first and second branches (12, 14) respectively comprising first and third mixers (16, 20) and second and fourth mixers (17, 21). An input terminal (10) for a signal having a carrier frequency ($\omega_c$) is connected to the first and second paths. A first local oscillator frequency ($\omega_o$) is supplied in quadrature to the first and second mixers (16, 17), where $\omega_c - \omega_o = \Delta\omega$ and $\Delta\omega$ is of the order of $2\pi \times 100$ radians/sec. A second local oscillator (30) frequency is supplied in quadrature to the third and fourth mixers (20, 21). An output signal is derived by connecting a sum circuit (22) and a difference circuit (24) to the first and second branches. The outputs of the sum and difference circuits (22, 24) are also used to provide gain and phase correction signals. It has been found that if the correction signals are based on signals centered on $2\Delta\omega$ then they are substantially free of ripple. The gain correction is derived by mixing the $2\Delta\omega$ signals derived by multiplying difference by difference (or sum by sum) with the $2\Delta\omega$ signals derived by multiplying sum by difference and low pass filtering. The phase correction is derived by mixing a 90° phase shifted difference signal with the sum signal (or vice versa) and deriving the $2\Delta\omega$ signals which are mixed with $2\Delta\omega$ signals derived by multiplying the difference by difference (or sum by sum) and low pass filtering.

20 Claims, 2 Drawing Sheets

GAIN AND PHASE CORRECTION IN A DUAL BRANCH RECEIVER

The present invention relates to gain and phase correction in a dual branch receiver.

Dual branch receivers are known per se example is disclosed in U.S. Pat. No. 4,633,315, in which FIG. 1 shows a dual branch receiver for television signals, comprising first and second branches respectively constituted by first and third mixers and second and fourth mixers. A signal input terminal is coupled to the first and second mixers, which also receive respectively in-phase and quadrature phase outputs of an r.f. local oscillator. The r.f. oscillator frequency ($\omega_o$) is offset by $\Delta\omega$ from the input carrier frequency ($\omega_c$), $\Delta\omega$ having as low a value as possible, preferably less than $2\pi \times 100$ radians/sec, and in no event exceeding $2\pi \times 200$ radians/sec. The input signal is mixed down to a baseband and then low pass filtered. An the third and fourth mixers the resulting signal is frequency upconverted using the quadrature related outputs of another, intermediate frequency, local oscillator. The in-phase and quadrature-phase signals in the first and second branches are applied to arithmetic combiners (a sum circuit and a difference circuit) by which the video and sound signals can be obtained. Splitting the input signal into two separate paths which are not truly identical means that the respective signals suffer from the effects of gain and phase differences between the paths. These imbalances give rise to interference and distortion.

In U.S. Pat. No. 4,633,315 gain and phase control are provided to correct for the imbalances between the two paths. Error signals for use in the control are derived from deviations in amplitude and phase of the image component in the frequency up-converted (or remodulated signal). The particular embodiment disclosed in FIG. 1 of the U.S. Patent uses the picture (or video) carrier signal V as a reference. This carrier signal is applied to a narrow band phase locked loop (PLL) which produces as detected carriers an in-phase carrier and a 90° out-of-phase carrier. These two detection carriers are applied to respective synchronous demodulators which also receive the output $\overline{V}$ of the difference circuit. The outputs of the synchronous demodulators are low pass filtered to provide d.c. voltages. The d.c. voltage derived from the in-phase carrier from the PLL is applied to an amplitude control circuit which controls the mixing gain of the fourth mixer by amplifying the oscillator mixing signal applied thereto. The d.c. voltage derived from the 90° out-of-phase PLL signal is used to effect phase control through a deviation of the phase quadrature relationship between the two I.F. oscillator mixing signals.

A mathematical analysis of this known dual branch receiver shows that there is a ripple component present in the d.c. control voltages, which ripple is negligible under most operating conditions. However in a situation in which the modulating signal has a component with a frequency nearly the same as the offset frequency $\Delta\omega$, then a very large ripple is likely to occur in the error signal for correcting the gain deviation. The presence of such a large ripple signal can cause instability in the correction loops.

The use of a narrowband PLL has the effect that the receiver has a relatively long acquisition time which can be tolerated in television receivers. However such a long acquisition time cannot be accepted in other applications involving dynamic switching of channels such as mobile radio receivers.

SUMMARY OF THE INVENTION

An object of the present invention is to reduce the risk of instability in the gain correcting loop of a dual branch receiver.

According to the present invention a dual branch receiver comprises a signal input terminal for an input signal having a carrier frequency ($\omega_c$), a first branch including first and third mixers, and a second branch including second and fourth mixers. The first and second mixers each have a signal input coupled to the signal input terminal. A first local oscillator for producing a local oscillator signal ($\omega_1$) is coupled to the first and second mixers. A first 90° phase shifter is provided in one of the signal paths to the second mixer, the third and fourth mixers being coupled to the first and second mixers, respectively, for receiving a down-converted signal therefrom. A second local oscillator is coupled to the third mixer, is coupled via a quadrature phase shifter to the fourth mixer, arithmetic combiners are used for obtaining the sum of the signals at the outputs of the third and fourth mixers, and for obtaining the difference between the signals at the outputs of the third and fourth mixers. Correcting circuits correcting gain and phase errors in the signal paths are coupled to the arithmetic combiners for transforming the outputs thereof to produce signals having terms centered on $2\Delta\omega$ where $\Delta\omega$ equals ($\omega_1 - \omega_c$).

As commonly used in mathematics, the term "arithmetic" will be used in this specification and claims to refer to addition and subtraction processes, while "geometric combiner" refers to a multiplier. Thus arithmetic combiners are circuits are circuits to produce the sum of difference of signals.

The present invention is based on the recognition of the fact that in the dual branch receiver disclosed in U.S. Pat. No. 4,633,315 the undesired ripple is due to the product of the desirable component ($S_W$) in the sum signal and the desirable component ($D_W$) in the difference signal. Therefore the ripple can be avoided by the product $S_W D_W$ not appearing in the d.c. control signal. Instead the sum and difference signals are transformed in such a way that signals centered on $2\Delta\omega$ are used to provide gain and phase correction signals.

In an embodiment of the present invention the transformation of the sum and difference signals involves a sequence of three main operations running contemporaneously in correcting circuits. In a first operation a first circuit including a geometric combiner multiplies the difference signal (diff) or the sum signal (sum) by itself, that is diff×diff or sum×sum, and the product is applied to a first filter which blocks d.c. and higher frequencies but passes signals centered on $2\Delta\omega$.

In a second contemporaneous operation a second correcting circuit includes a geometric combiner which multiplies the diff signal by the sum signal, that is diff×sum; and the product is applied to a second filter which passes signals centered on $2\Delta\omega$ and blocks d.c. and higher frequencies. The outputs of the first and second filtering means are mixed and the output is low pass filtered to provide a d.c. gain correction signal.

Either the sum signal and a 90° phase shifted difference (diff 90°) signal or the difference signal and a 90° phase shifted sum (sum 90°) signal are multiplied together in a third geometric combiner and the product is applied to a third filter which passes signals centered on $2\Delta\omega$ and blocks d.c. and higher frequencies. The outputs of the first and third filters are multiplied together and the output is low pass filtered to provide a d.c. phase correction signal.

The 90° phase shift of the arithmetically combined (sum or difference) signal may be carried out using a wideband phase locked loop. The use of a wideband PLL enables a fast acquisition time suitable for applications involving dynamic switching of channels such as mobile radio receivers to be achieved. Another benefit of using a PLL is that it can act as an FM demodulator.

The gain correction signal is applied to an adjustable gain amplifier provided in one of the branches, the other of the branches having a fixed gain amplifier. The phase correction signal is applied to the quadrature phase shifter which adjusts the relative phase between its outputs in response to the applied signal.

The present invention will be explained and described, by way of example, with reference to the accompanying drawings.

DESCRIPTION OF THE PREFERRED EMBODIMENT

Figure 1:
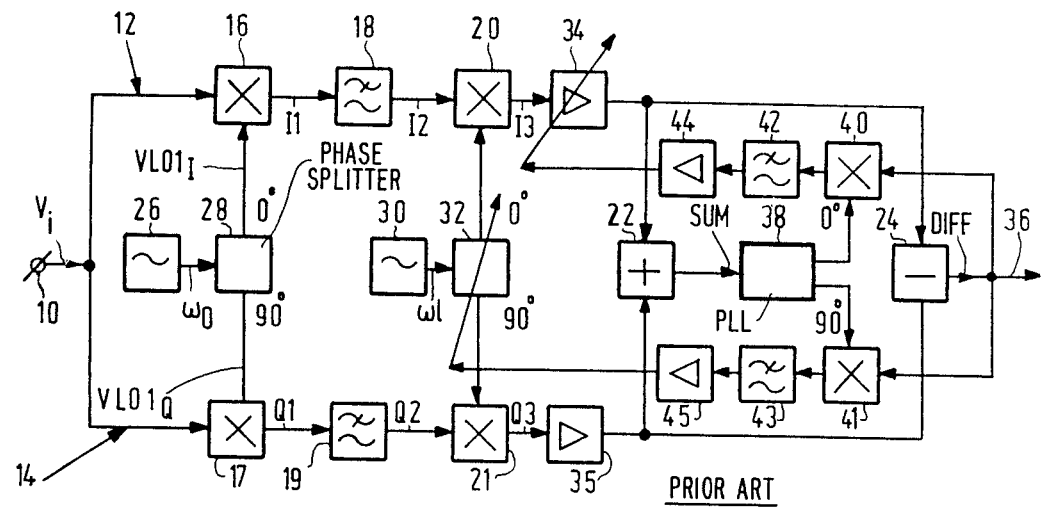
FIG. 1 is a simplified block schematic circuit diagram of a dual branch receiver of a type disclosed in U.S. Pat. No. 4,633,315.

In the drawings the same reference numerals have been used to illustrate corresponding features.

The receiver illustrated in FIG. 1 comprises an input terminal 10 for receiving an incoming carrier modulated signal. The type of modulation may be amplitude modulation (AM), angle modulation including frequency modulation (FM) and phase modulation (PM) or single sideband (SSB). For the sake of clarity the embodiments described will relate to a dual branch for FM demodulation. Such a receiver architecture can be adapted for AM, PM and SSB demodulation.

The incoming signal is split into two separate branches 12, 14. The branch 12 comprises a first mixer 16, a low pass filter 18 and third mixer 20 and the branch 14 comprises a second mixer 17, a low pass filter 19 and a fourth mixer 21. Arithmetic combiners, in the form of a summing circuit 22 and a differencing (or subtracting) circuit 24 have inputs for receiving signals provided by the third and fourth mixers 20, 21.

As is customary for dual branch receivers the incoming signal is converted into a pair of orthogonal baseband signals termed the in-phase signal I and the quadrature-phase signal Q. This conversion is carried-out in the first and second mixers 16, 17, by applying the outputs of a local oscillator 26 in quadrature to the mixers 16, 17. The quadrature outputs are provided by a phase shifter 28. The frequency of the local oscillator 26 is offset by (typically) 100 Hz from the carrier frequency of the incoming signal.

A non-illustrated alternative to the front end arrangement described is to connect the phase shifter 28 to the input terminal 10 and provide the quadrature outputs to the respective branches 12, 14. In this alternative the local oscillator 26 is connected directly to the mixers 16, 17.

Reverting to FIG. 1, the products of frequency down conversion in the mixers 16, 17 comprise signals I1 and Q1. These signals are applied to the respective low pass filters 18, 19 functioning principally for channel selectivity. The filtered signals I2, Q2 are remodulated up (or frequency-up converted) to an appropriate low intermediate frequency (IF) of, for example, 100 kHz in the quadrature related third and fourth mixers 20, 21. A second local oscillator 30 generates the IF carrier frequency which is applied to a 90° phase shifter 32. The remodulated signals I3, Q3 are applied to the summing and differencing circuits 22, 24 after amplification in amplifiers 34, 35. An output for application to an FM detector is derived from a terminal 36 which in the illustrated receiver circuit is connected to the output of the differencing circuit 24.

Remodulating-up the signals I2, Q2 enables conventional mixers instead of true multipliers to be used. Such multipliers which are required if the filtered I2, Q2 signals are directly used for demodulation are difficult to realise especially if they are required to have a high range. Additionally a limiter (not shown) can be used for FM demodulation to suppress undesirable amplitude modulation. This is an important consideration for mobile radio applications. Finally error signals for correcting gain and phase deviations occurring due to processing the incoming signal in two separate branches, in accordance with prior known techniques, can be readily derived from the remodulated signal.

The effects of these gain and phase deviations on a FM signal will now be examined mathematically.

ANALYSIS OF A PRIOR RECEIVER

FIG. 1 shows the signals at various points in the receiver architecture. Let the incoming FM signal be represented by $$V_i = E\cos(\omega_c t + \phi(t)) \quad (1)$$

where $\omega_c$ is the angular frequency of the transmitted carrier, and $\phi(t)$ is the information bearing phase function, given by $$\phi(t) = \psi \int f(t) dt$$

with $\psi$ being the peak frequency deviation, and $f(t)$, the modulating signal.

Now, due to stray reactive components at the input ports of the first quadrature mixing stage and the splitting junction, the input signal at the first mixer 16 is a delayed version of the signal at the second mixer 17, such that $$V'_i = E\cos(\omega_c(t-\gamma) + \phi(t-\gamma)) \approx E\cos(\omega_c t + \phi(t) - \alpha) \quad (2)$$

where $\gamma$ is the delay between the two branches, and $\alpha = \omega_c \gamma$ is the excessive phase due to delay $\gamma$, and $\alpha$ is dependent on the carrier frequency.

Let the two signals from the local oscillator 26 applied to the mixers 16, 17 be expressed respectively as $$V LO1_I = \cos(\omega_o t + \delta) \quad (3)$$

$$V LO1_Q = \sin(\omega_o t) \quad (4)$$

where $\omega_o$ is the angular frequency of the local oscillator 26 and $\delta$ is the phase deviation from orthogonality of the 90 degree phase shifter 28.

After mixing by the mixers 16, 17 the output signals are given by $$I1 = E/2 [\cos((\omega_o - \omega_c)t - \phi(t) + \alpha + \delta) + \cos(-(\omega_o + \omega_l)t + \phi(t) - \alpha + \delta)] \quad (5)$$

$$Q1 = E/2 [\sin((\omega_o - \omega_c)t - \phi(t)) + \sin((\omega_o - \omega_c)t + \phi(t))] \quad (6)$$

After filtering by the channel selectivity low pass filters 18 and 19, the output signals become $$I2 = \frac{G_I E}{2} \cos(\Delta\omega t - \phi(t) + \theta) \quad (7)$$

$$Q2 = \frac{G_Q E}{2} \sin(\Delta\omega t - \phi(t)) \quad (8)$$

where $\Delta\omega = \omega_o - \omega_c$ is the offset frequency, $G_I$ and $G_Q$ are the amplification factors of the I and Q channels respectively, and $\theta = \alpha + \delta$ is the excessive phase due to phase deviations.

Now the signals I2 and Q2 are remodulated up by the third and fourth mixers 20, 21 to an angular IF frequency of $\phi_1$, such that the outputs of the mixers 20 and 21 are respectively expressed as $$I3 = \frac{G_I E}{4} [\cos((\omega_l - \Delta\omega)t + \phi(t) - \beta - \theta) + \cos((\omega_l + \Delta\omega)t - \phi(t) - \beta + \theta)] \quad (9)$$

$$Q3 = \frac{G_Q E}{4} [\cos((\omega_l - \Delta\omega)t + \phi(t)) - \cos((\omega_l + \Delta\omega)t - \phi(t))] \quad (10)$$

where $\beta$ is the phase deviation from orthogonality of the 90 degree phase shifter 32 in the second quadrature modulator.

In order to regenerate the modulated FM signal at the intermediate frequency $\omega_1$, the two signals I3 and Q3 are combined together by either summing or subtracting these two signals in the circuit 22 or 24, such that $$\text{SUM} = I3 + Q3 \quad (11)$$
$$= \frac{G_I E}{4} \{[\cos((\omega_l - \Delta\omega)t + \phi(t) - \beta - \theta) + G_n \cos((\omega_l - \Delta\omega)t + \phi(t))] + [\cos((\omega_l + \Delta\omega)t - \phi(t) - \beta + \theta) - G_n \cos((\omega_l + \Delta\omega)t - \phi(t))]\}$$

$$\text{DIFF} = I3 - Q3 \quad (12)$$
$$= \frac{G_I E}{4} \{[\cos((\omega_l - \Delta\omega)t - \phi(t) - \beta + \theta) + G_n \cos((\omega_l + \Delta\omega)t + \phi(t))] + [\cos((\omega_l + \Delta\omega)t + \phi(t) - \beta - \theta) - G_n \cos((\omega_l - \Delta\omega)t + \phi(t))]\}$$

where $G_n = G_Q/G_I$ is the normalised gain factor with respect to $G_I$.

The SUM and DIFF signals of equations (11) and (12) can also be transformed into the forms, given by $$\text{SUM} = \frac{G_I E}{4} [\sqrt{(1 + G_n^2 + 2G_n \cos\gamma_d)} \cos((\omega_l - \Delta\omega)t + \phi(t) + \sigma + \sqrt{(1 + G_n^2 - 2G_n \cos\gamma_s)} \cos((\omega_l + \Delta\omega)t - \phi(t) + \rho_u)] \quad (13)$$

$$\text{DIFF} = \frac{G_I E}{4} [\sqrt{(1 + G_n^2 + 2G_n \cos\gamma_d)} \cos((\omega_l - \Delta\omega)t - \phi(t) + \rho_w) + \sqrt{(1 + G_n^2 - 2G_n \cos\gamma_d)} \cos((\omega_l + \Delta\omega)t + \phi(t) + \sigma_u)] \quad (14)$$

where $$\gamma_s = \beta + \theta$$
$$\gamma_d = \beta - \theta$$
$$\sigma_w = \arctan \frac{\sin\gamma_d}{\cos\gamma_d + G_n}$$
$$\sigma_u = \arctan \frac{\sin\gamma_d}{\cos\gamma_d - G_n}$$
$$\rho_w = \arctan \frac{\sin\gamma_s}{\cos\gamma_s + G_n}$$
$$\rho_u = \arctan \frac{\sin\gamma_s}{\cos\gamma_s + G_n}$$

Figure 2:
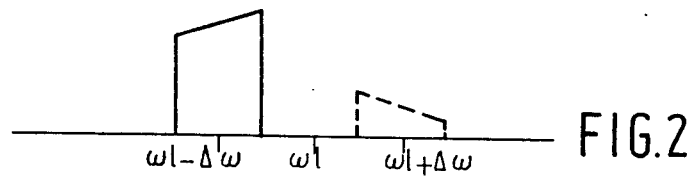
FIGS. 2 and 3 show the sum and difference signal envelopes.
Figure 3:
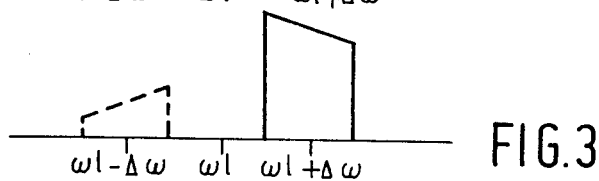

Due to the presence of gain and phase deviations, additional unwanted image signals have been generated in the SUM and DIFF signals as represented by the second term in equations (13) and (14), respectively. Equations (13) and (14) can be illustrated diagrammatically as shown in FIGS. 2 and 3 in which FIG. 2 represents the SUM signals and FIG. 3 the difference signals (DIFF). The unwanted image signals are shown in broken lines.

The presence of the unwanted image signal caused by gain and phase deviations gives rise to distortion and a whistling tone in the reproduced audio output. In the absence of modulation, the frequency of the whistling tone corresponds to two times the offset frequency $\Delta\omega$. This whistling tone is considered to be very annoying to the user, and as such it should be reduced to a very low level, for example, smaller than $-50$dB relative to 600 Hz at peak deviation.

The problem of whistling tones will not occur if there is no frequency offset between the transmitted carrier and the local oscillator frequency; that is, $\Delta\omega=0$. However, in a practical receiver of this type, ac-coupling has to be introduced in the two signal paths 12, 14 to prevent accumulation of dc offset voltages which reduce the dynamic ranges of the various circuits. Moreover, ac-coupling may cause severe audio distortion in a dual-branch direct conversion receiver. One way of reducing the audio distortion caused by ac-coupling is to intentionally introduce a low offset frequency, for example about 100 Hz. The value of the offset frequency is kept to as low as possible for two reasons: (i) insensitivity to a very low frequency tone in human hearing response, and (ii) to minimise the bandwidth extension necessary for accommodating this offset frequency by the selectivity filters 18 and 19.

As depicted in equations (13) and (14), the amplitude of the unwanted image associated with the SUM or DIFF signal provides a measure of the gain and phase deviations. In other words, if the unwanted image signal is suppressed, then we have corrected the gain and phase deviations. FIG. 1 illustrates a known method of using the image level as a measure for correcting gain and phase deviations.

Before describing the method in detail the circuit elements concerned will be described. The SUM signal from the summing circuit 22 is applied to a narrowband phase locked loop 38 which has a dual function in that it selects a carrier frequency for use as a detection carrier and it provides an in-phase detection carrier for use in gain correction and a quadrature phase shifted detection carrier for use in phase correction.

The output of the differencing circuit 24 is applied to synchronous demodulators 40, 41. The in-phase detection carrier is applied to the demodulation 40 and the quadrature-phase detection carrier is applied to the demodulator 41. The outputs of the demodulators 40, 41 are applied to respective low pass filters 42, 43 to obtain correction signals which after amplification in respective amplifiers 44, 45 are applied respectively to the amplifier 34 to vary its gain and to the phase shifter 32 to vary the relative phase of the IF carrier at its outputs.

The basis of the method is to multiply the SUM and DIFF signals together such that:

$$\text{SUM} \times \text{DIFF} = (S_w D_u + S_u D_w) + (S_w D_w + S_u D_u) \quad (15)$$

where
$S_w$ = desirable signal component in SUM,
$S_u$ = undesirable signal component in SUM,
$D_w$ = desirable signal component in DIFF,
$D_u$ = undesirable signal component in DIFF.

The terms within the first bracket of equation (15) will produce a dc signal, such that:

$$(S_w D_u)_{dc} + (S_u D_w)_{dc} = \frac{K}{2} [\sqrt{((1+G_n)^2 - (2G_n\cos\gamma_d)^2)} \cos\sigma_w - \sigma_u) + \sqrt{((1+G_n)^2 - (2G_n\cos\gamma_s)^2)} \cos\rho_w - \rho_u)] \quad (16)$$

$$= K(1 - G_n^2)$$

where $K = \left(\dfrac{G_I E}{4}\right)^2$.

The dc voltage given by equation (16) provides a control signal for correcting the gain deviations by adjusting the gain of the amplifier 34, the gain of the amplifier 35 being fixed. However, in addition to this desired dc error signal, an unwanted ripple signal is also present as indicated by the terms within the second bracket in equation (15). In practice the ripple signal introduced by the $S_u D_u$ term is small, and can therefore be ignored. As a result, the ripple signal is then given by $$S_w D_w = \quad (17)$$

$$\frac{K}{2} \sqrt{(1 + G_n^2 + 2G_n\cos\gamma_d)} \sqrt{(1 + G_n^2 + 2G_n\cos\gamma_s)} \times$$

$$\cos(2(\phi(t) - \Delta\omega t) + \sigma_w - \rho_w)$$

It can be observed from equation (17), that it the modulating signal $\phi(t)$ has a component with a frequency nearly the same as the offset frequency $\Delta\omega$, then a very large ripple is likely to occur in the error signal for correcting the gain deviation. This large ripple signal can cause instability in the correcting loop, and as such is one of the main disadvantages of this method of deriving the control signal for gain correction.

A control signal for correcting the phase deviation can also be derived in the similar way, but in this case either the SUM or DIFF signal has to be phase shifted by 90 degrees. Assuming that the SUM signal has been shifted by 90 degrees as shown in FIG. 1, so that $$\text{SUM90} \times \text{DIFF} = (S90_w D_u + S9- 0_u D_w) + (S90_w D_w + S90_u D_u) \quad (18)$$

where SUM90 is the SUM signal phase shifted by 90 degrees.

As with equation (15), the terms of equation (18) within the first bracket will provide the dc control signal, while the terms within the second bracket will give rise to undesired ripple signals. A closer examination of the dc terms will reveal the followings:

$$(S90_w D_u)_{dc} = \frac{K}{2} \sqrt{((1+G_n^2)^2 - (2G_n\cos\gamma_d)^2)} \sin(\sigma_w - \sigma_u) \quad (19)$$

$$= -KG_n\sin\gamma_d$$

$$(S90_u D_w)_{dc} = \frac{K}{2} \sqrt{((1+G_n^2)^2 - (2G_n\cos\gamma_s)^2)} \sin(\rho_u - \rho_w) \quad (20)$$

$$= KG_n\sin(\gamma_s)$$

$$= KG_n\sin(\gamma_d + 2\theta)$$

Equations (19) and (20) indicate that the polarities of the two dc signals are opposite; thus the resultant control signal is nearly zero. To avoid this, one of the two dc terms within the first bracket in equation (18) has to be filtered out. This is more conveniently done by filtering the SUM signal using the narrowband phase-locked loop PLL 38 as shown in FIG. 1. This PLL loop can also be used as a 90 degree phase shifter for the SUM signal. However, the need of a narrowband PLL will introduce an excessive acquisition time for the phase correcting loop, especially if a low offset frequency is chosen.

ANALYSIS OF THE INVENTION

Figure 4:
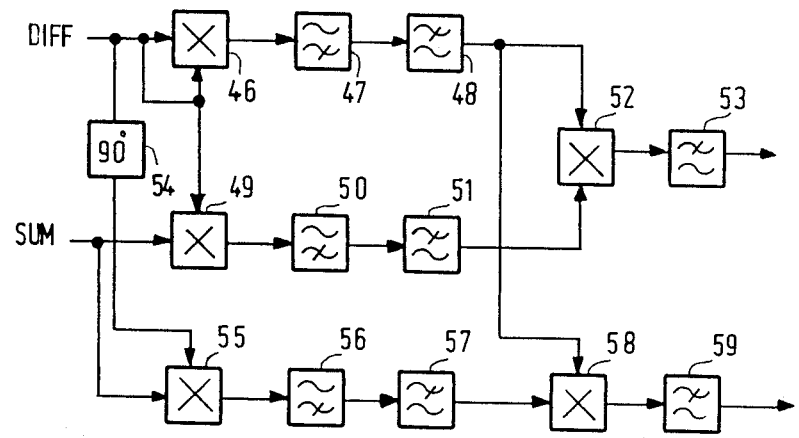
FIG. 4 is a block schematic circuit diagram illustrating a method of obtaining gain and phase correction signals in the dual branch receiver made in accordance with the present invention.
Figure 5:
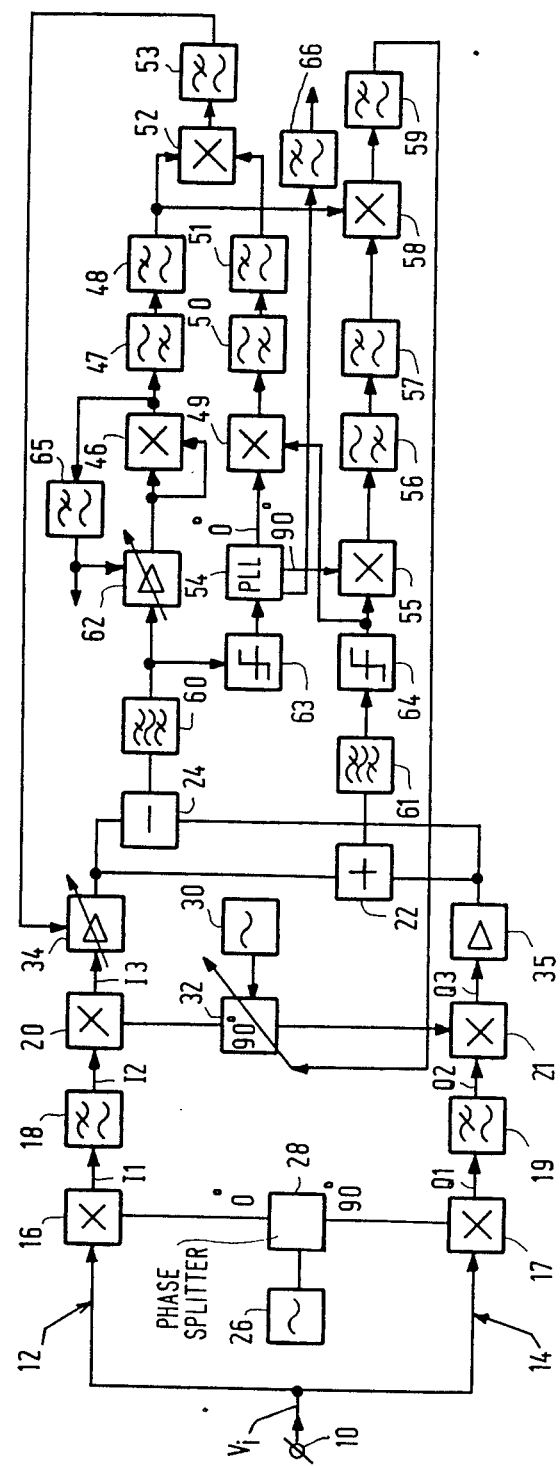
FIG. 5 is a block schematic circuit diagram of a dual branch radio receiver made in accordance with the present invention.

Referring now to FIGS. 4 and 5 the receiver circuit made in accordance with the present invention is aimed at reducing significantly the ripple level of the control signal in the presence of modulation as compared with the receiver circuit described with reference to FIG. 1 in which the product of $S_w$ and $D_w$ appears in the dc control signal.

The image signal in either the SUM or DIFF could be used as a measure of the amplitude of deviations in gain and phase. For illustration, the DIFF signal has been chosen for this purpose. From FIG. 4, the DIFF signal is self-multiplied with itself, in a first multiplier 46, and cross-multiplied with the SUM signal in a second multiplier 49. The results of these multiplications are as follows:

(i) DIFF×DIFF $$\text{DIFF} \times \text{DIFF} = (D_u D_u + D_w D_w) + (D_u D_w + D_w D_u) \quad (21)$$

The terms within the first bracket in equation (21) will produce dc signals and signals centered at $2\omega_1$, such that $$D_u D_u = \frac{K}{2}(1 + G_n^2 - 2G_n \cos\gamma_d) \times \quad (22)$$
$$[1 + \cos 2((\omega_I - \Delta\omega)t + \phi(t) + \sigma_u)]$$

$$D_w D_w = \frac{K}{2}(1 + G_n^2 + 2G_n \cos\gamma_s) \times \quad (23)$$
$$[1 + \cos 2((\omega_I - \Delta\omega)t - \phi(t) + \rho_w)]$$

The terms within the second bracket in equation (21) produce a signal centered at $2\Delta\omega$, and at $2\omega_1$, such that $$2(D_u D_w) = \quad (24)$$

$$K \sqrt{(1 + G_n^2 + 2G_n\cos\gamma_s)} \sqrt{(1 + G_n^2 - 2G_n\cos\gamma_d)} \times$$
$$[\cos(2\Delta\omega t - 2\phi(t) + \rho_w - \sigma_u) + \cos(2\omega_I t + \rho_w + \sigma_u)]$$

The large dc signals expressed in equations (22) and (23) are blocked by a high pass filter 47, while the signals centered at $2\omega_1$ are filtered away by a low pass filter 48 as shown in FIG. 4. In practice, the filters 47 and 48 are realised as a CR (capacitance-resistance) high pass network and a RC low pass network, respectively. The signal centered at $2\Delta\omega$ as given in equation (24) is used for deriving the necessary control signal as to be discussed in the following paragraphs.

(ii) DIFF×SUM $$\text{DIFF} \times \text{SUM} = (S_w D_u + S_u D_w) + (S_w D_w + S_u D_u) \quad (25)$$

The terms within the first bracket in equation (25) produce a dc signal and a signal centered at $2\omega_1$. Again, the dc signal will be blocked by a high pass filter 50 and the $2\omega_1$ terms will be filtered away by a low pass filter 51 as shown in FIG. 4.

Now, the terms within the second bracket in equation (25) will produce signals centered at $2\Delta\omega$ and $2\omega_1$ terms will be filtered away leaving only the $2\Delta\omega$ terms. Further if it is assumed the signal $(S_w D_w)$ to be much greater than $(S_u D_u)$, then the resulting signal centered at $2\Delta\omega$ is approximated by $$(\text{DIFF} \times \text{SUM})_{2\Delta\omega} \approx \quad (26)$$

$$\frac{K}{2} \sqrt{(1 + G_n^2 + 2G_n\cos\gamma_d)} \times \sqrt{(1 + G_n^2 + 2G_n\cos\gamma_s)} \times$$
$$\cos(2\Delta\omega t - 2\phi(t) + \rho_w - \sigma_w)$$

If the signals centered as $2\Delta\omega$ from the filtered (DIFF×DIFF) and the filtered (DIFF×SUM) as given by equation (24) and equation (26), respectively, are multiplied together in a multiplier 52, the resulting signal becomes $$(\text{DIFF} \times \text{DIFF})_{2\Delta\omega} \times (\text{DIFF} \times \text{SUM})_{2\Delta\omega} = \quad (27)$$

$$\frac{K^2}{4}(1 + G_n^2 + 2G_n\cos\gamma_s)\sqrt{((1 + G_n^2)^2 - (2G_n\cos\gamma_d)^2)} \times$$
$$[\cos(\sigma_w - \sigma_u) + \cos(4\Delta\omega t - \phi(t)) + 2\rho_w - \sigma_u - \sigma_w)]$$

It can be observed from equation (27) that the dc term has the same peak value as the ripple term centered at $4\Delta\omega$. The desirable dc signal of equation (27) can be further simplified to $$\epsilon_G = \frac{K^2}{4}(1 + G_n^2 + 2G_n\cos\gamma_s)(1 - G_n^2) \quad (28)$$

The dc signal of equation (28) after low pass filtering by a low pass filter 53 can then be used as a control signal for correcting the gain deviation. As can be observed in equation (28), when there is no gain imbalance between the I and Q channels, then $G_n$ is unity, and the control signal $E_G$ becomes zero.

For the phase correction, it is required to phase shift either the SUM of DIFF signal by 90 degrees before performing (DIFF×SUM). A convenient mean for carrying out this phase shifting is to use a wideband PLL 54. Further, it is preferred to perform this phase shifting on the same signal that is being used for the (SUM×SUM) if (DIFF×DIFF). In this case, the wideband PLL 54 can also act as the FM demodulator by taking the demodulated signal from the input of the voltage controlled oscillator (VCO) in the PLL54 followed by an appropriate low pass filter 66 to its output, thus simplifying hardware implementation. Unlike the use of a narrowband PLL in the known receiver described with reference to FIG. 1, the wideband PLL 54 does not introduce any significant acquisition delay in the phase correction loop.

In the illustrated example the DIFF signal is shifted by 90 degrees, so that $$\text{DIFF90} \times \text{SUM} = (S_w D90_u + S_u D90_w) + (S_w D90_w + S_u D90_u) \quad (29)$$

As before, the terms within the first bracket of equation (29) will produce signals at dc and $2\omega_1$. These signals are not used and will be filtered away by a combination of a high pass filter 56 and a low pass filter 57. The desirable signal centered at $2\delta\omega$ will be produced from the terms within the second bracket of equation (29). Again, if the $(S_u D90_u)$ term is ignored, then $(S_w D90_w)$ becomes $$S_w D90_w = \quad (30)$$

$$\frac{K^2}{2} \sqrt{(1 + G_n^2 + 2G_n \cos\sigma_s)} \sqrt{(1 + G_n^2 + 2G_n \cos\sigma_d)} \times$$

$$[\sin(2\omega_1 t + \rho_w + \sigma_w) - \sin(2\Delta\omega t - 2\phi(t) + \rho_w - \sigma_w)]$$

Now, if the filtered $(S_w D90_w)$ is multiplied in a multiplier 58 with the filtered (DIFF×DIFF), the resultant signal will be $$(\text{DIFF} \times \text{DIFF})_{2\Delta\omega} \times (\text{DIFF90} \times \text{SUM})_{2\Delta\omega} = \quad (31)$$

$$-\frac{K^2}{4}(1 + G_n^2 + 2G_n\cos\gamma_s)\sqrt{((1+G_n^2)^2 - (2G_n\cos\gamma_d)^2)} \times$$

$$[\sin(\sigma_u - \sigma_w) + \sin(4\Delta\omega t - 4\phi(t) + 2\rho_w - \sigma_u - \sigma_w)]$$

From equation (31), it is observed that the peak amplitude of the desired dc signal is the same as that of the unwanted ripple signal. After some trigonometrical manipulations, the desirable dc error signal $\epsilon_{PH}$ for phase deviation can be shown to be $$\epsilon_{PH} = -\frac{K^2}{2} G_n(1 + G_n + 2G_n\cos\gamma_s)\sin\gamma_d \quad (32)$$

Equation (32) indicates that when $\gamma_d$ is zero, then the control signal for phase correction as given by equation (32) also becomes zero.

Note that $\gamma_d$ is defined as $$\gamma_d = \beta - \theta = \beta - (\alpha + \delta) \quad (33)$$

Therefore any phase deviation ($\delta$) introduced by the first phase shifter 28 and excessive phase in the signal path ($\alpha$) could be corrected by appropriately adjusting the second phase shifter 32 to provide a value of ($\beta$) such that $\gamma_d$ equals to zero as shown in the complete functional block diagram shown in FIG. 5.

In the interests of brevity FIG. 5 will not be described in detail because its basic construction and operation can be readily ascertained from FIGS. 1 and 4.

However, the receiver shown in FIG. 5 has a number of additional circuit elements. The outputs of the summing and differencing circuits 22, 24 are connected to bandpass filters 60, 61. A variable gain amplifier 62 is connected in the signal path between the bandpass filter 60 and the mixer 46. Signal shaping means or limiters 63, 64 are connected to the respective bandpass filters 60, 61. The output of the shaping means 62 is connected to the PLL 54 and the output of the shaping means 64 is connected to the mixers 49, 55.

A control signal for the variable gain amplifier 62 is derived from the output of the mixer 46 and filtered in low pass filter 65. The requirement for an extra gain control comes about due to the fact that the control signals for correcting the gain and phase deviations are sensitive to changes in amplitude of the received signal which governs the value for $K$ ($=(G_I E/4)^2$) in equations (28) and (32). Introducing an extra AGC by means of the amplifier 62 keeps the control signals independent of variations in the amplitude of the received signal. In the illustrated embodiment the error signal for the AGC is readily derived from the dc signal of $(D_w D_w + D_u D_u)$ term of equation (21). After filtering in the low pass filter 65, this dc signal can be used to control the gain of the amplifier 62. Alternatively, this AGC control signal can also be used to regulate the amplitude levels of the I and Q channels in accordance with the amplitude variation of the incoming signal; that is, an adjustable gain amplifier (not shown) may be connected to the input terminal 10 prior to the signal path being split or at an appropriate position in the I and Q paths.

The method of deriving control signals for correcting gain and phase deviations in a dual-branch receiver does not require the use of a narrowband PLL for signal filtering, and as such it does not suffer from uncertainty of signal acquisition.

Also, the amplitudes of the unwanted ripples associated with the control signals in the presence of modulation are much less than those of the known receiver described with reference to FIG. 1. Therefore the time constants of the filters used for lowpass filtering these control signals can be made smaller, thus improving the speed of the correcting loops.

The method of deriving the control signals is also more flexible than the known method because the low pass and high pass filters used in the receiver made in accordance with the present invention can be optimised to improve reduction in unwanted ripple signal without introducing excessive acquisition time.

Although multiplication functions have been used to illustrate the principle of the present invention, they can be realised using conventional switching mixers, e.g., balanced mixers.

What is claimed is:
1. A dual branch receiver comprising:
 a signal input terminal for an input signal having a carrier frequency ($\omega_c$),
 a first branch including first and third mixers,
 a second branch including second and fourth mixers,
 two arithmetic combiners for combining signals from said branches to provide respective first and second combiner outputs, the first and second mixers each having a signal input coupled through a respective input signal path to the signal input,
 a first local oscillator for producing a local oscillator signal ($\omega_o$) couples through respective oscillator signal paths to the first and second mixers,
 a first 90° phase shifter provided in one of the signal paths to the second mixer, the third and fourth mixers being coupled to the first and second mixers, respectively, for receiving a down converted signal therefrom,
 a second local oscillator coupled to the third mixer and coupled through a quadrature phase shifter to the fourth mixer, one of said arithmetic combiners being a summing means for obtaining the sum of the signals at the outputs of the third and fourth mixers, the other of said arithmetic combiners being a differencing means for obtaining the differ- ence between the signals at the outputs of the third and fourth mixers, and means for correcting gain and phase errors in said branches, said correcting means being coupled to the summing and differencing means for transforming the outputs thereof to produce signals having terms centered on $2\Delta\omega$, where $\Delta\omega$ equals $(\omega_o - \omega_c)$.

2. A receiver as claimed in claim 1, characterized in that the correction means comprises:

first means for multiplying one of said combiner outputs by itself to form a first product, first filtering means for deriving terms centered on $2\Delta\omega$ in said first product, second means for multiplying the difference signal by the sum signal to form a second product, second filtering means or deriving terms centered on $2\Delta\omega$ in said second product, third means for multiplying together the terms centered on $2\Delta\omega$ in said first and second products to produce a third product which provides, after low pass filtering, a signal for use in gain correction, another phase shifter for phase shifting by 90° said first combiner output, fourth means for multiplying the 90° phase shifted version of said first combiner output with the second combiner output to form a fourth product, third filtering means for deriving terms centered on $2\Delta\omega$ in said fourth product, and fifth multiplying means for multiplying together the terms centered on $2\Delta\omega$ in the first and fourth products to form a fifth product which, after low pass filtering, constitutes a signal for use in phase correction.

3. A receiver as claimed in claim 2, further comprising another adjustable gain amplifier coupled between the differencing circuit and the first multiplying means, a low pass filter connected to the output of the first multiplying means and to a control input of the another adjustable gain amplifier.

4. A receiver as claimed in claim 2, characterized in that the quadrature phase shifter has a control input connected to receive the phase correction signal.

5. A receiver as claimed in claim 2, further comprising a fixed gain amplifier in one of the branches and an adjustable gain amplifier in the other of the branches, the adjustable gain amplifier having a control input connected to receive the gain correction signal.

6. A receiver as claimed in claim 5, further comprising another adjustable gain amplifier coupled between the differencing circuit and the first multiplying means, a low pass filter connected to the output of the first multiplying means and to a control input of the another adjustable gain amplifier.

7. A receiver as claimed in claim 2, characterized in that the another phase shifter comprises a wideband phase locked loop.

8. A receiver as claimed in claim 7, further comprising a fixed gain amplifier in one of the paths and an adjustable gain amplifier in the other of the paths, the adjustable gain amplifier having a control input connected to receive the gain correction signal.

9. A receiver as claimed in claim 7, further comprising another adjustable gain amplifier coupled between the differencing circuit and the first multiplying means, a low pass filter connected to the output of the first multiplying means and to a control input of the another adjustable gain amplifier.

10. A receiver as claimed in claim 2, characterised in that the first, second and third filtering means each comprise a high pass filter connected in series with a low pass filter.

11. A receiver as claimed in claim 10, further comprising another adjustable gain amplifier coupled between the differencing circuit and the first multiplying means, a low pass filter connected to the output of the first multiplying means and to a control input of the another adjustable gain amplifier.

12. A receiver as claimed in claim 10, characterised in that the quadrature phase shifter has a control input connected to receive the phase correction signal.

13. A receiver as claimed in claim 10, further comprising a fixed gain amplifier in one of the branches and an adjustable gain amplifier in the other of the branches, the adjustable gain amplifier having a control input connected to receive the gain correction signal.

14. A receiver as claimed in claim 10, characterised in that the another phase shifter comprises a wideband phase locked loop.

15. A receiver as claimed in claim 14, further comprising a fixed gain amplifier in one of the branches and an adjustable gain amplifier in the other of the branches, the adjustable gain amplifier having a control input connected to receive the gain correction signal.

16. A receiver as claimed in claim 4, wherein the wideband phase locked loop also functions as a demodulator.

17. A receiver as claimed in claim 16, further comprising a fixed gain amplifier in one of the branches and an adjustable gain amplifier in the other of the branches, the adjustable gain amplifier having a control input connected to receive the gain correction signal.

18. A receiver as claimed in claim 17, characterised in that the quadrature phase shifter has control input connected to receive the phase correction signal.

19. A receiver as claimed in claim 18, further comprising another adjustable gain amplifier coupled between the differencing circuit and the first multiplying means, a low pass filter connected to the output of the first multiplying means and to a control input of the another adjustable gain amplifier.

20. A receiver as claimed in claim 17, further comprising another adjustable gain amplifier coupled between the differencing circuit and the first multiplying means, a low pass filter connected to the output of the first multiplying means and to a control input of the another adjustable gain amplifier.

* * * * *